(12) United States Patent
Hu et al.

(10) Patent No.: US 9,134,349 B2
(45) Date of Patent: Sep. 15, 2015

(54) AMPLIFIER CIRCUITS AND METHODS

(71) Applicant: BCD Semiconductor Manufacturing Limited, George Town, Grand Cayman (KY)

(72) Inventors: Jinxi Hu, Shanghai (CN); Jiabin Wang, Shanghai (CN); Xujiang Huang, Shanghai (CN)

(73) Assignee: BCD Semiconductor Manufacturing Limited, Shanghai (CN)

( * ) Notice: Subject to any disclaimer, the term of this patent is extended or adjusted under 35 U.S.C. 154(b) by 323 days.

(21) Appl. No.: 13/711,571

(22) Filed: Dec. 11, 2012

(65) Prior Publication Data
US 2014/0028286 A1 Jan. 30, 2014

(30) Foreign Application Priority Data

Jul. 26, 2012 (CN) .......................... 2012 1 0261412

(51) Int. Cl.
| | |
|---|---|
| *G01R 15/20* | (2006.01) |
| *G01R 33/07* | (2006.01) |
| *H03F 3/387* | (2006.01) |
| *H03F 3/45* | (2006.01) |

(52) U.S. Cl.
CPC .............. *G01R 15/202* (2013.01); *G01R 33/07* (2013.01); *H03F 3/387* (2013.01); *H03F 3/45475* (2013.01); *H03F 3/45995* (2013.01); *H03F 2200/261* (2013.01); *H03F 2203/45138* (2013.01); *H03F 2203/45528* (2013.01); *H03F 2203/45538* (2013.01); *H03F 2203/45551* (2013.01); *H03F 2203/45588* (2013.01); *H03F 2203/45624* (2013.01); *H03F 2203/45634* (2013.01); *H03F 2203/45681* (2013.01)

(58) Field of Classification Search
CPC .............................. G01R 15/20; G01R 15/202
USPC .................... 324/117, 202, 207.02, 225, 251; 257/251; 341/155
See application file for complete search history.

(56) References Cited

U.S. PATENT DOCUMENTS

| | | | |
|---|---|---|---|
| 6,522,131 B1 * | 2/2003 | Hiligsmann et al. ........ | 324/207.2 |
| 2002/0149506 A1 * | 10/2002 | Altrichter et al. ............. | 341/155 |
| 2003/0155912 A1 * | 8/2003 | Motz ............................. | 324/225 |

(Continued)

FOREIGN PATENT DOCUMENTS

| | | |
|---|---|---|
| CN | 101923266 A | 12/2010 |
| CN | 101782634 B | 7/2013 |

OTHER PUBLICATIONS

China Intellectual Property Office office action for application CN20121261412 dated Dec. 2, 2014.

*Primary Examiner* — Minh N Tang

(57) ABSTRACT

A chopper amplifier circuit for sensing Hall voltage with reduced offsets includes a Hall sampling circuit with a first switching circuit for selectively coupling each of four nodes of a Hall plate to either a power source or a ground terminal. The circuit also includes a differential amplifier and a second switching circuit configured for selectively coupling each of the four nodes to inputs of the differential amplifier. A Hall voltage signal retaining circuit includes two groups of four storage devices and a second group of four storage devices. A third switching circuit is configured for outputs of the differential amplifier to selected ones of the storage devices. A fourth switching circuit is configured for selectively coupling the storage devices outputs of the chopper amplifier circuit.

20 Claims, 13 Drawing Sheets

(56) References Cited

U.S. PATENT DOCUMENTS

| | | | |
|---|---|---|---|
| 2008/0238410 A1* | 10/2008 | Charlier et al. | 324/202 |
| 2009/0189553 A1* | 7/2009 | Arnet | 318/400.3 |
| 2010/0308801 A1* | 12/2010 | Ogawa et al. | 324/207.2 |
| 2012/0025817 A1* | 2/2012 | Romero et al. | 324/251 |

* cited by examiner

AMPLIFIER CIRCUITS AND METHODS

CROSS-REFERENCES TO RELATED APPLICATIONS

This application claims priority to Chinese Patent Application No. 201210261412.1, filed Jul. 26, 2012, by inventors J. Hu, et al., commonly owned and incorporated in its entirety by reference herein for all purposes.

TECHNICAL FIELD

This application is related to determining electrical signals in the presence of a magnetic field. In particular, embodiments of the invention are related to circuits and methods of amplifiers for Hall voltage measurement with reduced effects of offset voltage.

BACKGROUND OF THE INVENTION

A Hall sensor is often used in magnetic applications to measure magnetic fields, or inspect materials. A Hall sensor includes a Hall plate, which is a semiconductor crystal that varies its voltage in response to a magnetic field. Hall effect sensors are used for proximity switching, positioning, speed detection, and current sensing applications. Hall sensors are commonly used to time the speed of wheels and shafts, such as for internal combustion engine ignition timing, tachometers and anti-lock braking systems. They are used in brushless DC electric motors to detect the position of the permanent magnet. This arrangement can also be used to regulate the speed of disk drives.

Because Hall voltage is often on the order of millivolts, the output from this type of sensor cannot be used to directly drive actuators but instead must be amplified. In such amplifiers, offset voltages are often unavoidable. A chopper amplifier uses clock signals to control amplification of an input signals. It can reduce effect of offset voltage on signal amplification. Therefore chopper-controlled amplifiers have been used in the detection of Hall voltage.

Even though conventional chopper amplifiers have been used to reduce offset voltages in Hall voltage measurement, they are often not adequate in applications that require lower offset voltage. Therefore, improved techniques for more effective Hall voltage measurement with lower offset voltages are highly desirable.

BRIEF SUMMARY OF THE INVENTION

This application is related to determining electrical signals in the presence of a magnetic field. In particular, embodiments of the invention are related to circuits and methods of amplifiers for voltage measurement with reduced effects of offset voltage. Merely by way of example, embodiments of the invention are applied to chopper amplifiers for Hall voltage measurement with reduced effects of offset voltage. The methods and circuits can be used in motor drive circuits. But it would be recognized that the invention has a much broader range of applicability.

According to some embodiments of the invention, a chopper amplifier circuit for sensing Hall voltage with reduced offsets includes a Hall sampling circuit which includes a first switching circuit for selectively coupling each of four nodes of a Hall plate to either a power source or a ground terminal. The circuit also includes a differential amplifier and a second switching circuit configured for selectively coupling each of the four nodes of the device to inputs of the differential amplifier. A Hall voltage signal retaining circuit includes a first group of four storage devices and a second group of four storage devices. A third switching circuit is configured for storing a first output of the differential amplifier to one of the first group of four storage devices and for storing a second output of the differential amplifier to one of the second group of four storage devices. A fourth switching circuit is configured for selectively coupling the first group of four storage devices to a first output of the chopper amplifier circuit and for coupling the second group of four storage devices to a first output of the chopper amplifier circuit.

In some embodiments of the above amplifier circuit the switching circuits are configured for measuring and storing first voltage samples by applying an electric current and sampling voltages at a first node and a third node diagonally across from each other, with the electric current flowing between a second and a fourth node such that the current flows in the Hall plate from right to left with respect to the first node and from left to right with respect to the third node. The amplifier circuit repeats the above measuring and storing three more times with different nodes assignments. The amplifier circuit is also configured for averaging the four voltage samples to provide an output Hall voltage. In some embodiments, the amplifier circuit also includes a control circuit configured for issuing clock signals to carry out the measuring and storing steps in four different time periods. In some embodiments, the switching circuits include MOS transistors, and in some other embodiments, the switching circuits include bipolar transistors.

According to some other embodiments, a Hall voltage sensing system includes an input terminal for coupling to a power source, a first and a second differential output terminals, a current source coupled to the input terminal for providing a current. The system also includes a Hall plate having four nodes, designated as nodes A, B, C, and D, respectively, a first and a second amplifier circuits in a differential configuration, and a plurality of capacitors. The system also includes a switching circuit responsive to a set of clock signals and configured to perform the following measurements.

during a first time period, applying a first current from D to B and coupling C and A to input terminals of the first and second amplifier circuits, respectively, and charging first and second capacitors with outputs of the first and the second amplifiers, respectively;

during a second time period, applying a second current from C to A and coupling D and B to input terminals of the first and second amplifier circuits, respectively, and charging third and fourth capacitors with outputs of the first and the second amplifiers, respectively;

during a third time period, applying a third current from B to D and coupling C and A to input terminals of the first and second amplifier circuits, respectively, and charging fifth and sixth capacitors with outputs of the first and the second amplifiers, respectively;

during a fourth time period, applying a fourth current from A to C and coupling B and D to input terminals of the first and second amplifier circuits, respectively, and charging seventh and eighth capacitors with outputs of the first and the second amplifiers, respectively;

during a fifth time period, coupling the first, second, third, and fourth capacitors to the first different output terminal, and coupling the fifth, sixth, seventh, and eighth capacitors to the second differential output terminal.

In some embodiments of the above system, a differential Hall voltage signal is provided at the first and the second differential output terminals. In some embodiments, the first output terminal is at a voltage that is an average of voltages on the first, second, third, and fourth capacitors, and the second output terminal is at a voltage that is an average of voltages on the fifth, sixth, seventh, and eighth capacitors. In some embodiments, the switching circuits include MOS transistors, and in some other embodiments, the switching circuits include bipolar transistors.

According to still other embodiments of the invention, a test circuit for testing a device with four terminals includes a power source for providing power to the device, a ground terminal, first and second differential output terminals, a differential amplifier circuit with first and second inputs and first and second outputs, a first group of four storage devices, and a second group of four storage devices. The test circuit also has a first switching circuit configured for selectively coupling each of the four terminals to either current source or the ground terminal, a second switching circuit configured for selectively coupling each of the four terminals of the device to the inputs of the differential amplifier circuit, a third switching circuit configured for storing one of the first or the second outputs of the differential amplifier circuit to one of the first group of four storage devices and for storing the other output of the differential amplifier circuit to one of the second group of four storage devices, and a fourth switching circuit for selectively coupling the first group of four storage devices to the first differential output of the system and for coupling the second group of four storage devices to the second differential output of the system.

In some embodiments of the above test circuit the switching circuits are configured for measuring and storing first signal samples at a first node and a second node, while coupling the power source between a third and a fourth node, and repeating the above measuring and storing steps three more times with different nodes assignments. The test circuit is also configured for determining an output of the test circuit based on the four measured voltage samples. In some embodiments, the signal samples comprise voltage signals. In some other embodiments, the signal samples comprise current signals. In some embodiments, the test circuit is configured for testing a Hall plate. In some embodiments, the switching circuits include MOS transistors, and in some other embodiments, the switching circuits include bipolar transistors.

According to some alternative embodiments of the invention, a method for determining a Hall voltage for a Hall plate having four nodes includes performing the following sampling steps with each one of the four nodes:
  selecting one of the four nodes
    providing a current from a first node adjacent to and counterclockwise from the selected node to a second node adjacent to and clockwise from the selected node;
    determining a voltage on a third node across from the selected node and including said voltage in a first group of sampled voltages; and
    determining a voltage on the selected node and including said voltage in a second group of sampled voltages.
The method also includes determining a first differential output voltage based on the first group of sampled voltages, and determining a second differential output voltage based on the second group sampled voltages.

In some embodiments of the above method the first differential output voltage is equal to an average of the voltages in the first group of sampled voltages, and the second differential output voltage is equal to an average of the voltages in the second group of sampled voltages. In some embodiments, the method includes storing charges representing the voltage on one of a first group of capacitors. In some embodiments, the method includes storing a numerical value representing the voltage in a memory device.

In some embodiments, the above method also includes controlling the sampling steps with a computer processor, storing voltage values in a memory device, and computing the differential output voltages based on the first and the second groups of sampled voltages using the computer processor.

Various additional embodiments, features, and advantages of the present invention can be appreciated with reference to the detailed description and accompanying drawings that follow.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

According to some embodiments of the invention, a new Hall voltage sampling method uses four samplings of the Hall voltage. The method is implemented in a chopper amplifier with differential inputs and differential outputs, and is more effective in eliminating the effect of offset voltage on Hall voltage. The circuit can be applied to linear Hall IC design for magnetic field strength location detection. It can also be used in switching Hall IC design for motor drive control.

Figure 1:
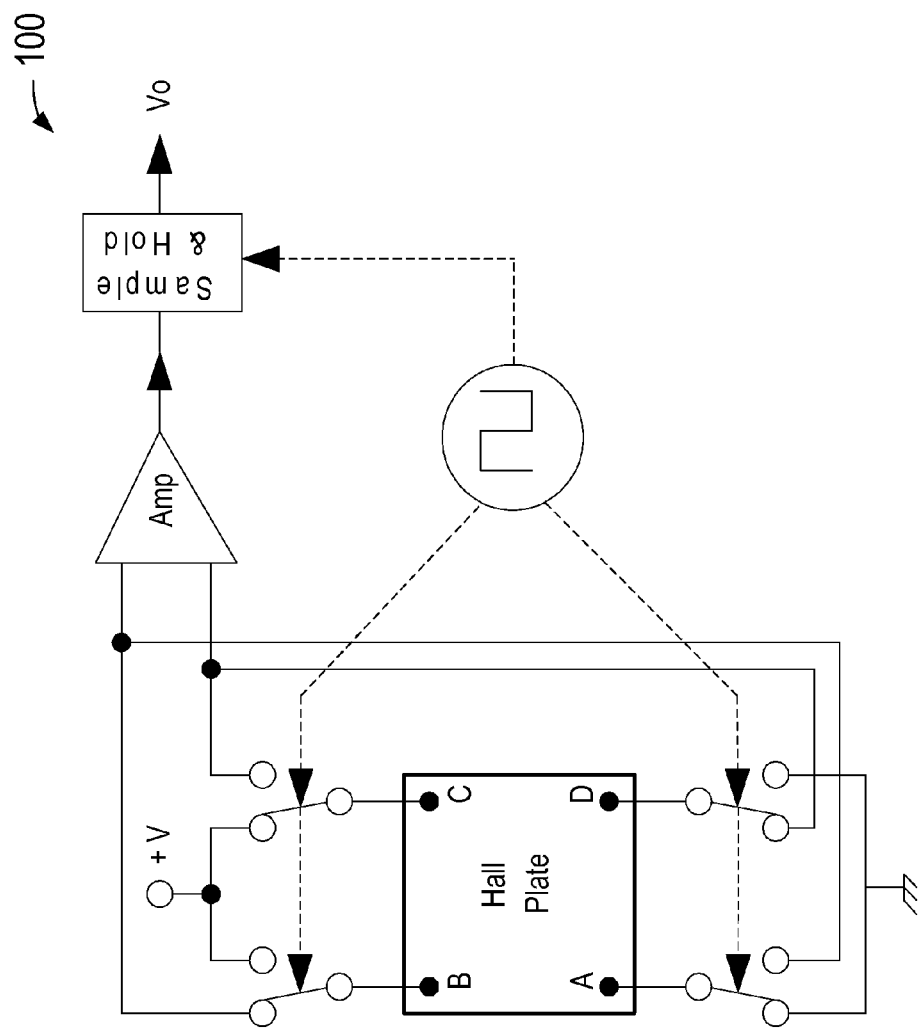
FIG. 1 is a block diagram illustrating a conventional chopper amplifier.

FIG. 1 is a block diagram illustrating a conventional chopper amplifier 100. In this circuit, the Hall voltage is sampled twice. First, when a current is flowing from terminal A to terminal C, the Hall voltage Vh between terminals B and D is sampled. Then, when a current is flowing from terminal B to terminal D, the Hall voltage Vh between terminals C and A is sampled. In these two sampling steps, the Hall voltages have the same magnitude, but opposite polarities. The offset voltages Vhos1 and Vhos2 have the same magnitude and the same polarity. When these two sampled signals are amplified under the control of two logic signals having opposite phase and sampled, the offset voltage is canceled. This allows the Hall voltage to be determined.

The output Vo of circuit 100, the Hall voltage Vo after the sample and hold circuit can be expressed as:

$$V_o = Vh \times \text{Gain} + (V_{hos1} - V_{hos2}) \times \text{Gain}$$

In theory, $V_{hos1}=V_{hos2}$ and $V_o=Vh\times Gain$. However, in reality, Hall offset voltages, Vhos1 and Vhos2 are not identical. Therefore, the measured Hall voltage, Vo still includes a small offset voltage, which may be undesirable in certain applications.

Figure 2:
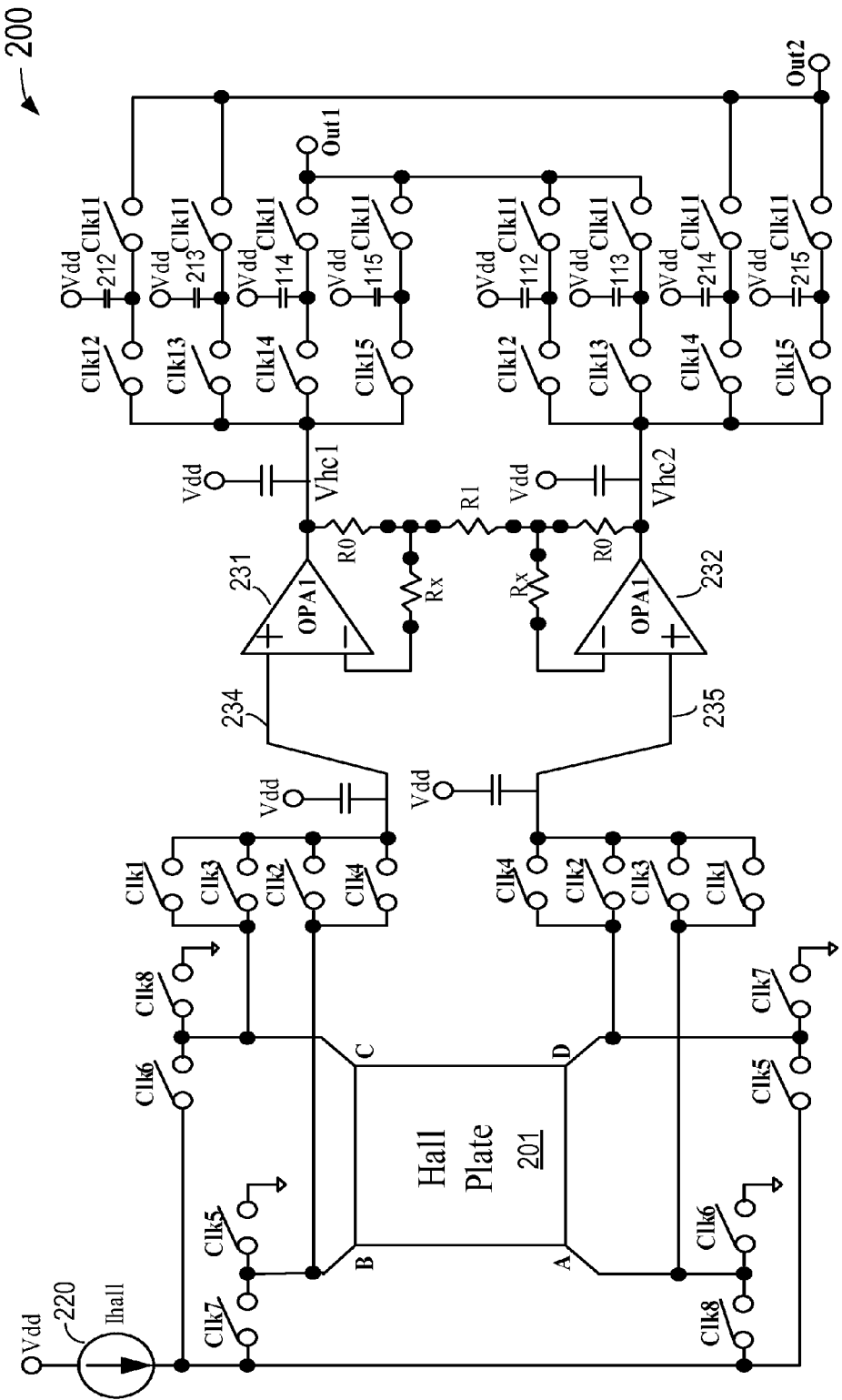
FIG. 2 is a simplified schematic diagram illustrating a system for testing a device according to an embodiment of the present invention.

FIG. 2 is a simplified schematic diagram illustrating a system 200 for testing a device according to an embodiment of the present invention. System 200 is a system for testing a device having four terminals, or nodes. As shown in FIG. 2, system 200 includes a power source Vdd for providing power to the device, a ground terminal, and first and second differential output terminals Out1 and Out2. In the embodiment of FIG. 2, system 200 is used to reduce offset voltage in Hall voltage measurement. But it is appreciated that system 200 can be used in other testing applications as well. In FIG. 2, the device under test is a Hall plate 201 having four nodes A, B, C, and D. A current source 220 is connected to power supply Vdd for providing a test current Ihall. System 200 also includes a first switching circuit for selectively coupling each of the four nodes, A, B, C, and D, to either current source 220 or the ground terminal. In FIG. 2, the first switching circuit includes switches controlled by clock signals Clk5, Clk6, Clk 7, and Clk 8. For example, node A of Hall plate 201 can be coupled to current source 220 through a switch controlled by clock signal Clk8, and to the ground through a switch controlled by clock signal Clk6. Similar arrangements are made for nodes B, C, and D.

In FIG. 2, system 200 also has a differential amplifier circuit, including operational amplifiers 231 and 232, with first and second inputs 234 and 235, and first and second outputs labeled Vhc1 and Vhc2. A second switching circuit is configured for selectively coupling each of the four nodes A, B, C, and D of device 201 to first and second inputs 234 and 235 of the differential amplifier. For example, node A of Hall plate 201 can be coupled to input 235 of the differential amplifier circuit through switches controlled by clock signals Clk1 and Clk3. Similar arrangements are made for nodes B, C, and D.

System 200 also includes a first group of four storage devices, capacitors 112, 113, 114, and 115, which are selectively coupled to outputs Vhc1 or Vhc2 of the differential amplifier circuit through four switches controlled by clock signals Clk12, Clk13, Clk14, and Clk15, respectively. A second group of four storage devices, capacitors 212, 213, 214, and 215, are selectively coupled to outputs Vhc1 or Vhc2 of the differential amplifier circuit through four switches controlled by clock signals Clk12, Clk13, Clk14, and Clk15, respectively.

System 200 further includes a fourth switching circuit for selectively coupling four of the first group and the second group of four storage devices to the first differential output of the system and coupling the other four of the first group and the second group of four storage devices to the second differential output of the system. In some embodiments, such as shown in FIG. 2, the fourth switching circuit is configured for coupling the first group of four storage devices to the first differential output of the system and coupling the second group of four storage devices to the second differential output of the testing circuit.

Even though the above description is based on an example of a device under test having four terminals and including groups of four storage devices. It is understood that the structure is not limited to such an example. The structure and method applies to devices having more than four terminals. The method can also include multiple groups of storage devices, with each group having four or more storage devices. In some embodiments, the switches can be MOS transistors, and in other embodiments, the switches can be bipolar transistors, or other kinds of electronic switches. In some embodiments of the invention, the capacitors can be implemented as MOS capacitors in a silicon integrated circuit. In a specific embodiment, the capacitors are implemented with polysilicon-to-polysilicon capacitors. The system described in FIG. 2 can be used in a linear Hall integrated circuit or a switched Hall integrated circuit, depending on the embodiments.

As described below, with suitable arrangement of the clock signals, system 200 can be used in methods for reducing the offset voltage in the measurement of Hall voltages. In some embodiments, the method determining a Hall voltage for a Hall plate having four nodes proceeds as follows. Starting with one of the four nodes, the first measure step includes providing a current from a first node adjacent to and counterclockwise from the selected node to a second node adjacent to and clockwise from the selected node. A voltage measurement is taken on the selected node as a first sampled voltage, and a voltage measurement is taken a fourth node across from the selected node as a second sampled voltage. In other words, a first voltage samples are taken by applying an electric current and sample voltages at a first node and a third node diagonally across therefrom, with the electric current flowing between a second and a fourth node such that the current flows in the Hall plate from right to left with respect to the first node and from left to right with respect to the third node. Next, the measurement step is carried out with the second, the third, and the fourth nodes. In some embodiments, the four measurements are amplified and averaged to provide differential output voltages at the output terminals. An specific example is described with reference to the timing sequence of the clock signals in FIG. 3.

Figure 3:
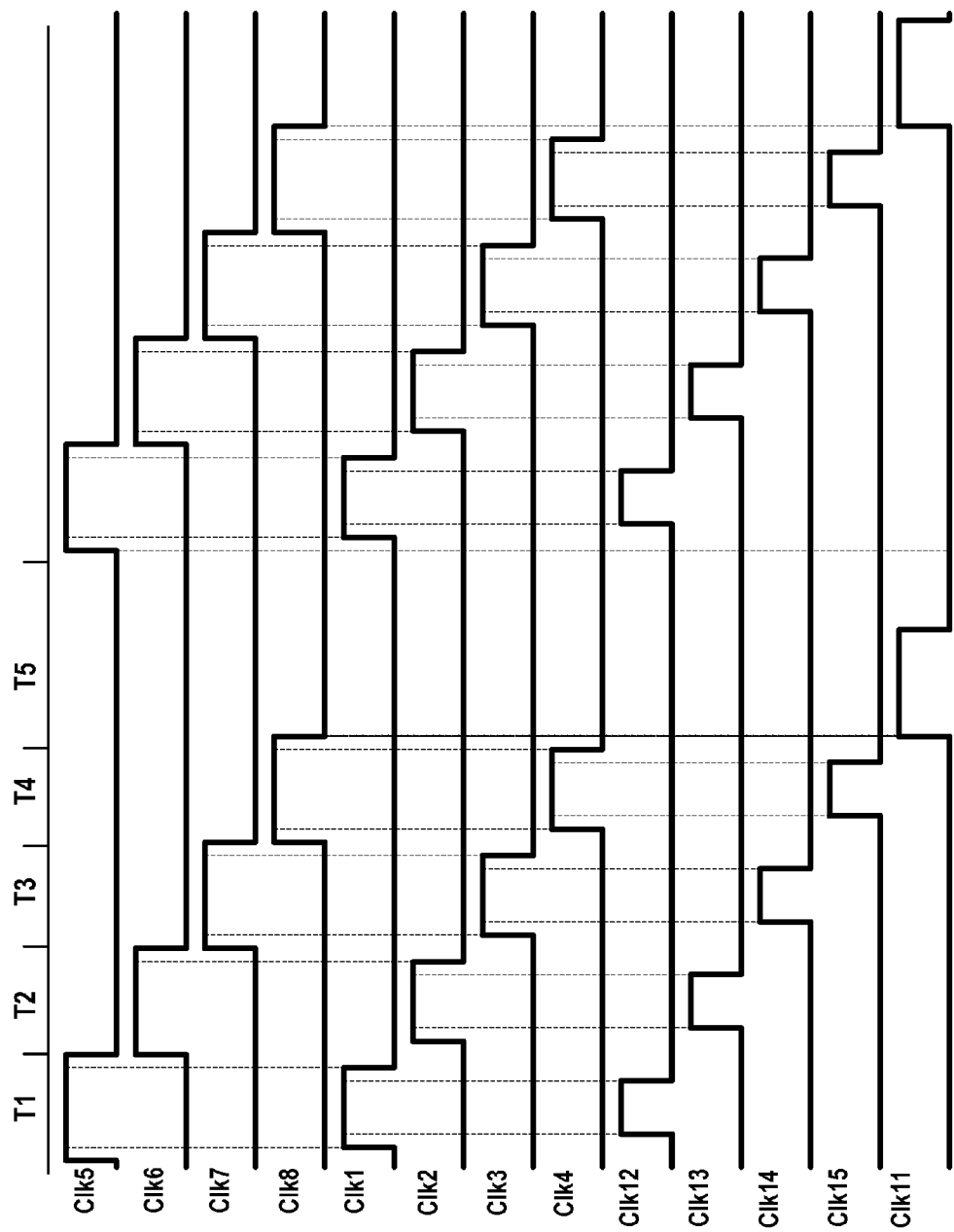
FIG. 3 is a timing diagram illustrating clock signals used in an operation of the amplifier circuit of FIG. 2 according to an embodiment of the present invention.

FIG. 3 is a timing diagram illustrating clock signals used in an operation of the amplifier circuit of FIG. 2 according to an embodiment of the present invention. As shown in FIGS. 2 and 3, four samplings of the Hall voltage are carried out in one operational cycle.

1. During time period T1, clock signals 5, 1, and 12 are high, and a current Ihall is applied from terminal D to terminal B, and the voltage is taken at terminal C and terminal A.
2. During time period T2, clock signals 6, 2, and 13 are high, and a current Ihall is applied from terminal D to terminal B, and the voltage is taken at terminal C and terminal A.
3. During time period T3, clock signals 7, 3, and 14 are high, and a current Ihall is applied from terminal D to terminal B, and the voltage is taken at terminal C and terminal A.
4. During time period T4, clock signals 8, 4, and 15 are high, and a current Ihall is applied from terminal D to terminal B, and the voltage is taken at terminal C and terminal A.
5. During time period T5, clock signal Clk11 is high and all other clock signals are low. The sampled signals are transferred to output terminals Out1 and Out2.

Figure 4:
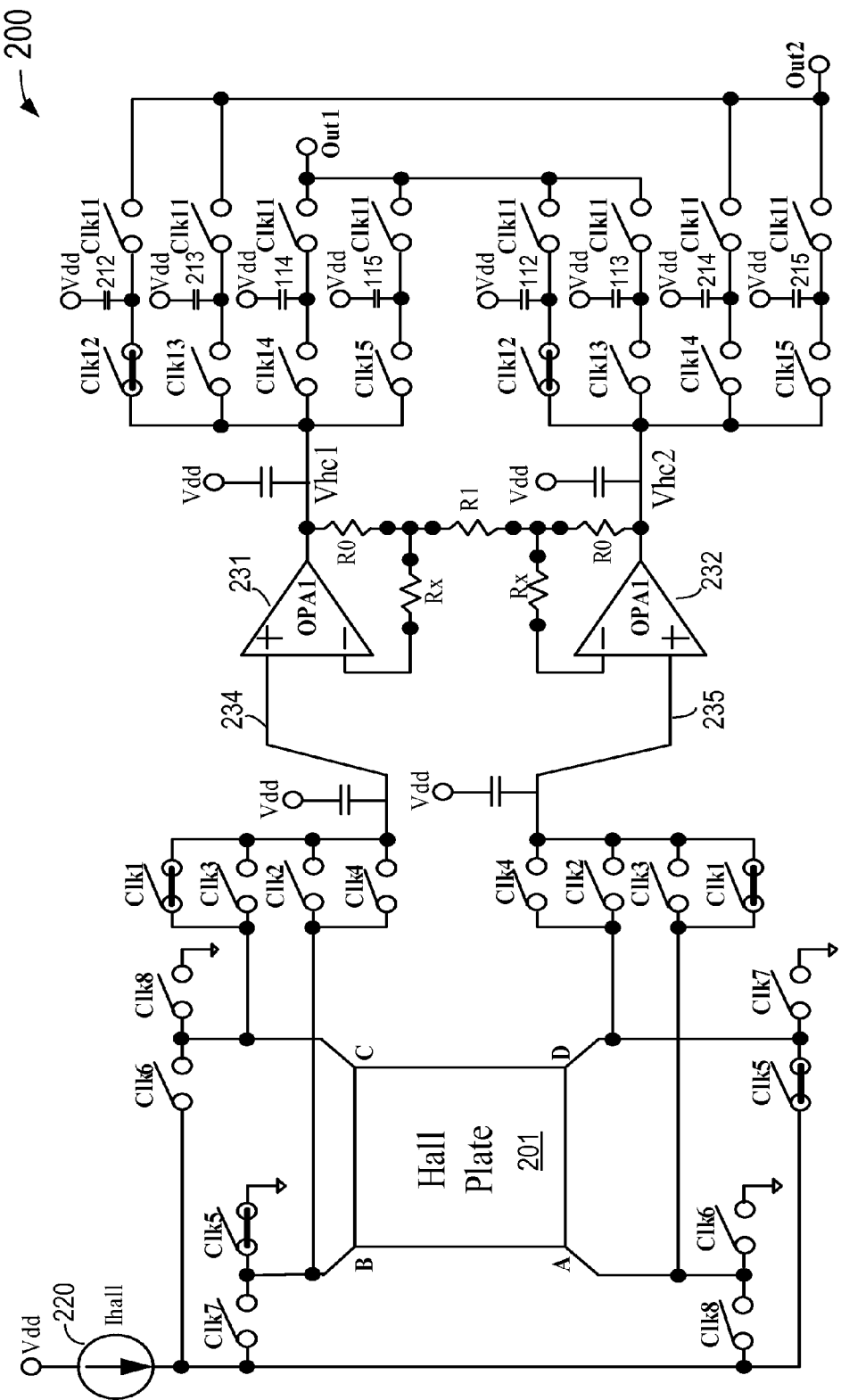
FIG. 4 shows the positions switch amplifier circuit of FIG. 2 during a first time period.
Figure 4A:
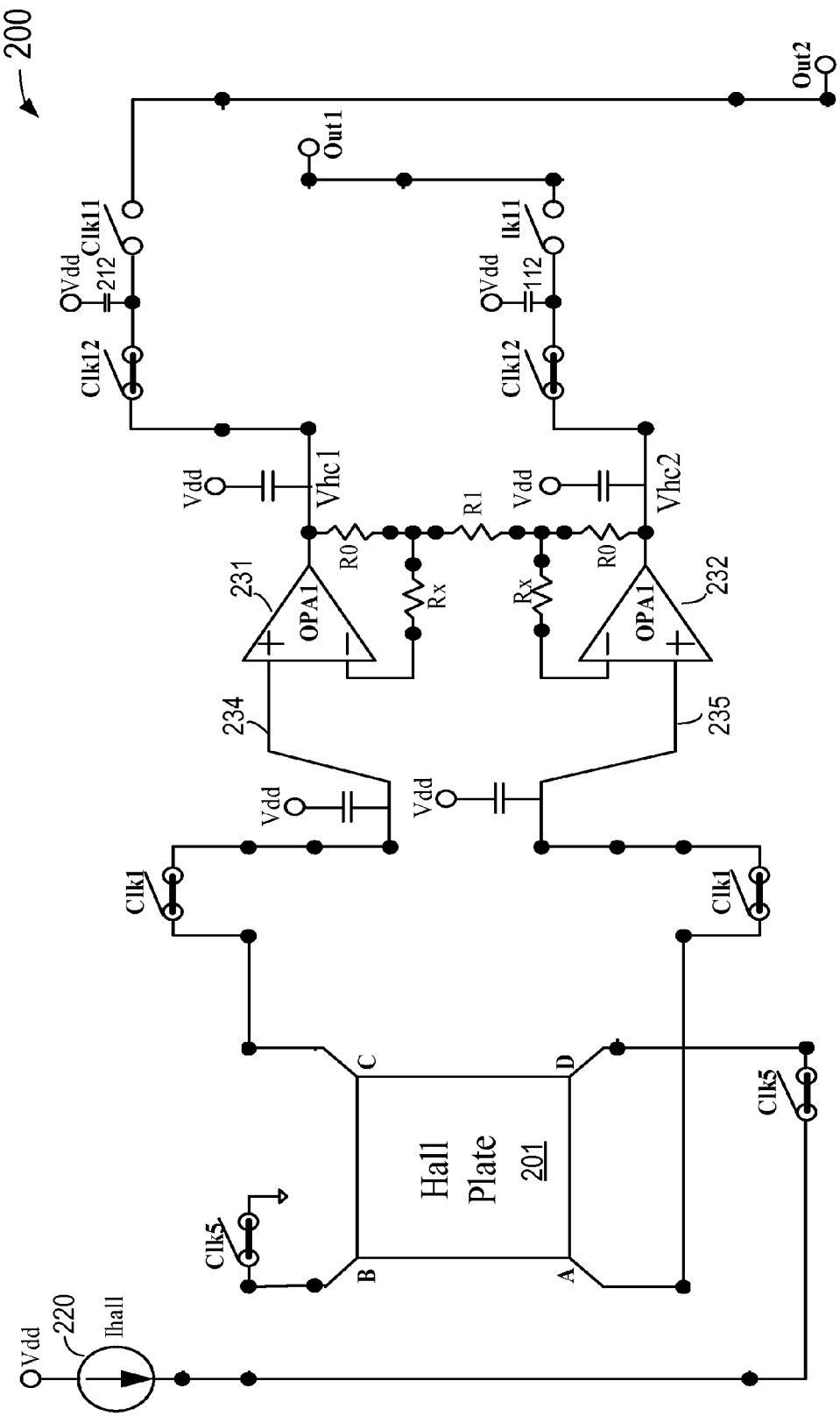
FIG. 4A shows the effective connections during the period.

The specific connections of the switching circuits are now described in more detail with respect to nodes A, B, C, and D, and clock signals Clk1-Clk15. FIG. 3 shows that, during a first time period T1, switches under control of Clk5, Clk1, and Clk 12 are closed, and all other switches are open. FIG. 4 shows the positions of switches of system 200 during T1, and FIG. 4A shows the effective connections during T1. It can be seen in FIG. 4A that a current is applied from nodes D to B, and voltages at nodes C and A are coupled to input terminals of the first 231 and second 232 amplifier circuits, respectively. During the first time period T1, capacitors 112 and 212 are charged with outputs of the first and the second amplifiers 231 and 232, respectively. Capacitors 112 and 212 now hold the sampled voltages of nodes C and A, respectively. Note that the width of clock signal Clk1 is narrower than that clock signal Clk5, so a stable current is established when the voltages are fed to the amplifiers. Also, the width of clock signal Clk12 is narrower than that clock signal Clk1, so stable voltages are sampled at the capacitors.

Figure 5:
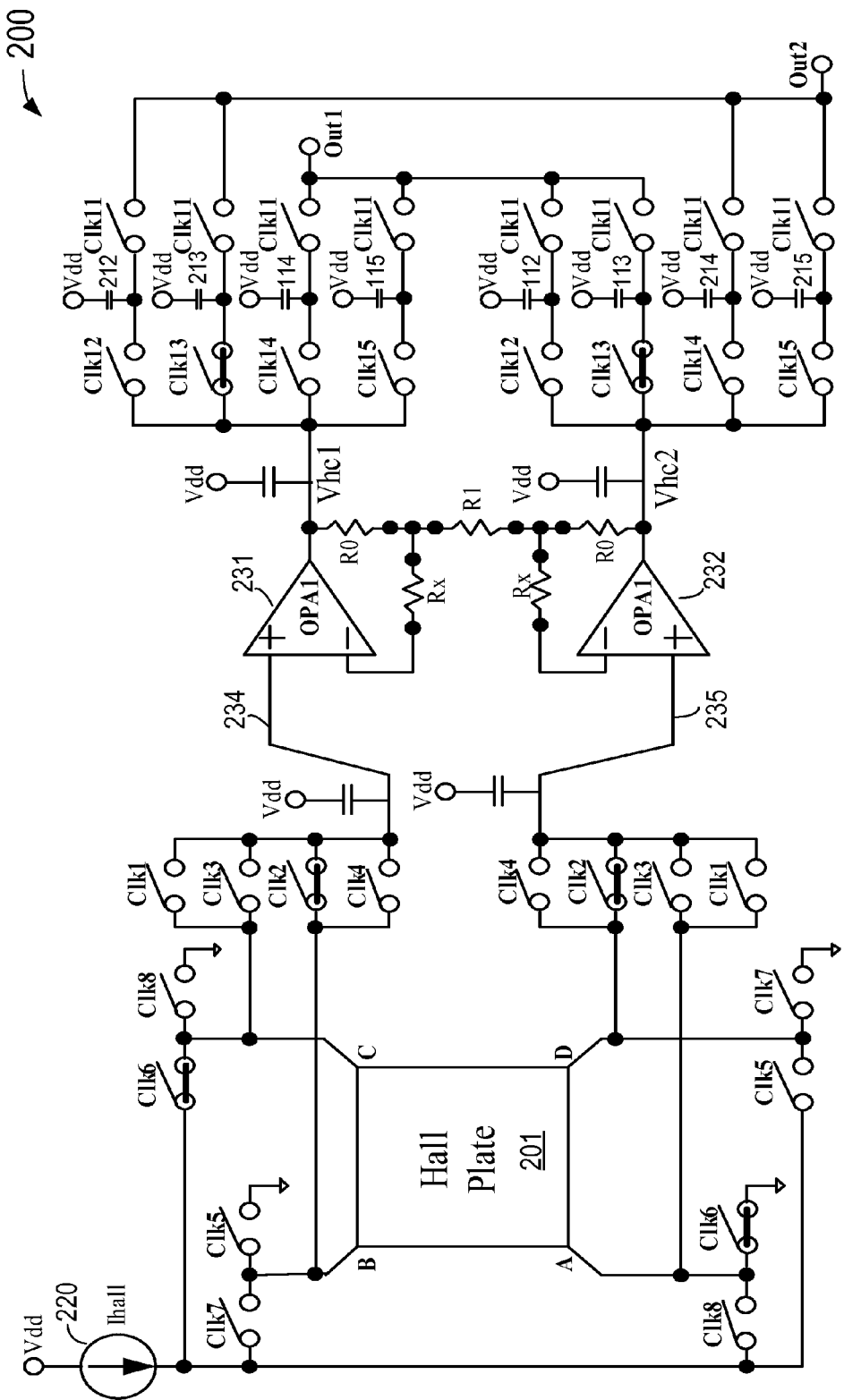
FIG. 5 shows the positions switch amplifier circuit of FIG. 2 during a second time period.
Figure 5A:
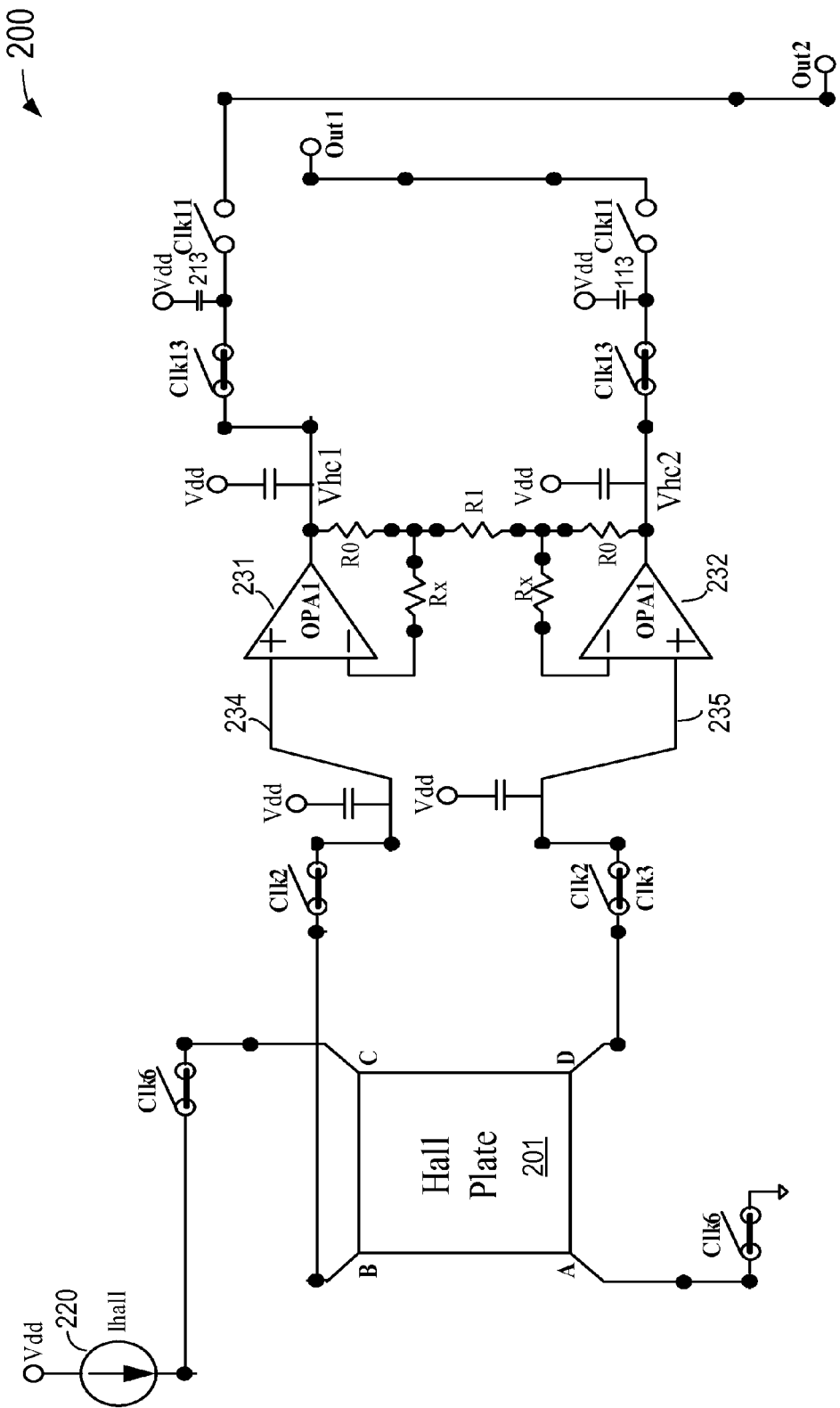
FIG. 5A shows the effective connections during the period.

Similar operations take place during time periods T2, T3, and T4. During a second time period T2, as shown in FIG. 3, switches under control of Clk6, Clk2, and Clk13 are closed, and all other switches are open. FIG. 5 shows the positions of switches of system 200 during T2, and FIG. 5A shows the effective connections during T2. It can be seen in FIG. 5A that a current is applied from C to A, and voltages at nodes B and D are coupled to input terminals of the first 231 and second 232 amplifier circuits, respectively. During time period T2, capacitors 113 and 213 are charged with outputs of the first and the second amplifiers 231 and 232, respectively. Capacitors 113 and 213 now hold the sampled voltages of nodes B and D, respectively. The relative pulse width of clock signals Clk6, Clk2, and Clk13 during period T2 is similar to that for period T1.

Figure 6:
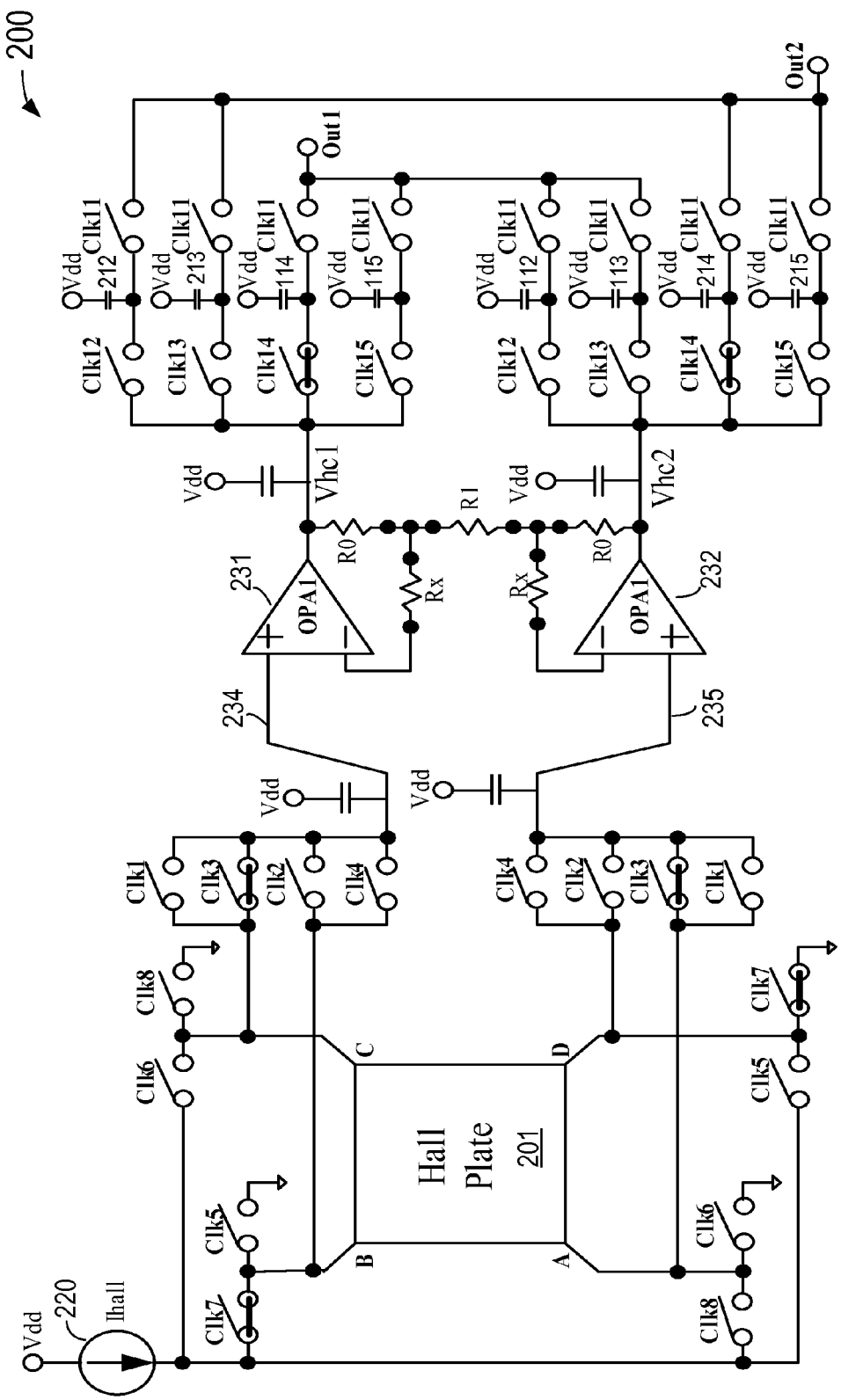
FIG. 6 shows the positions switch amplifier circuit of FIG. 2 during a third time period.
Figure 6A:
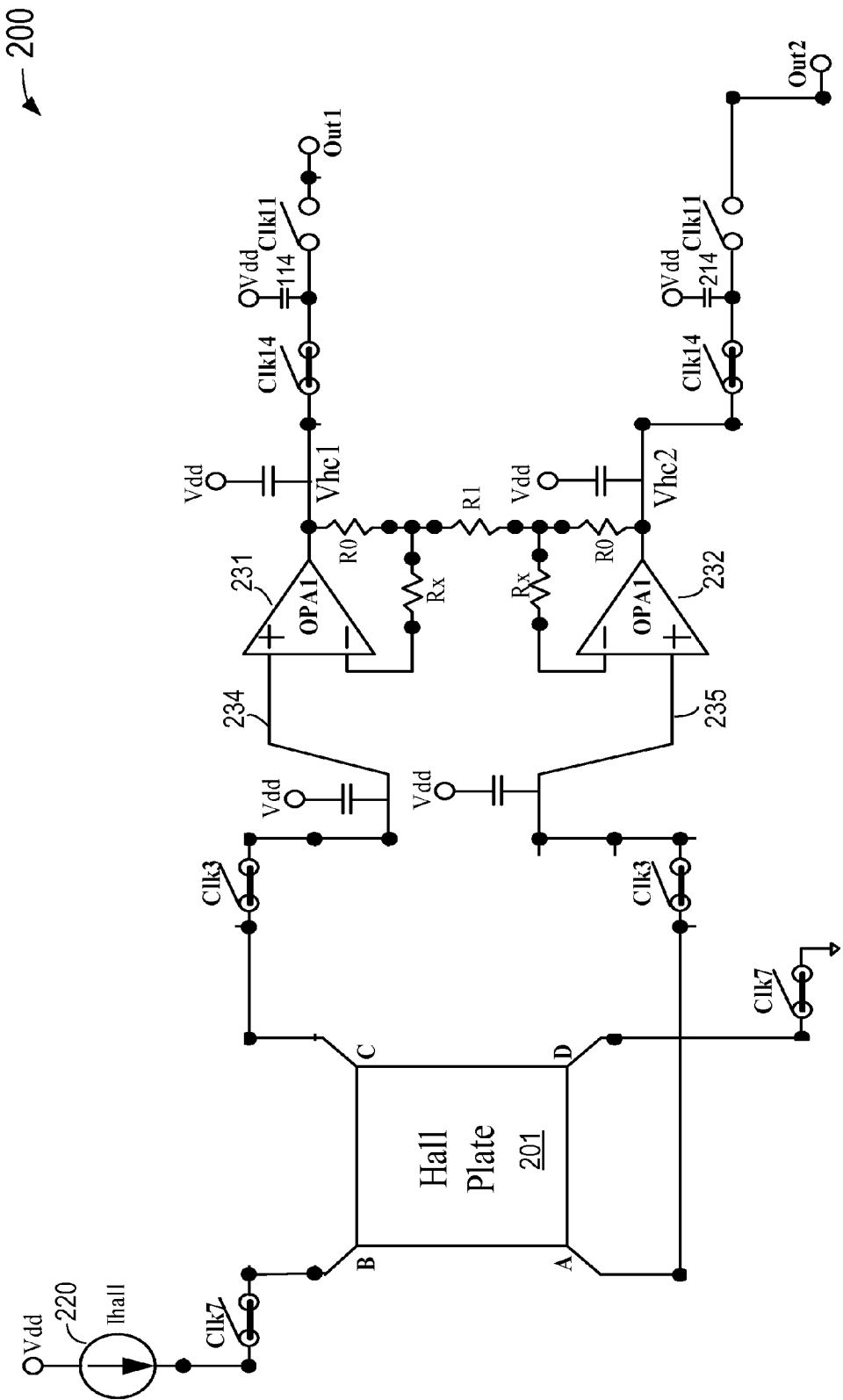
FIG. 6A shows the effective connections during the period.

During a third time period T3, as shown in FIG. 3, switches under control of Clk7, Clk3, and Clk14 are closed, and all other switches are open. FIG. 6 shows the positions of switches of system 200 during T3, and FIG. 6A shows the effective connections during T3. It can be seen in FIG. 6A that a current is applied from nodes B to D, and voltages at nodes C and A are coupled to input terminals of the first 231 and second 232 amplifier circuits, respectively. During time period T3, capacitors 114 and 214 are charged with outputs of the first and the second amplifiers 231 and 232, respectively. Capacitors 114 and 214 now hold the sampled voltages of nodes C and A, respectively. The relative pulse width of clock signals Clk7, Clk3, and Clk14 during period T3 is similar to that for period T1.

Figure 7:
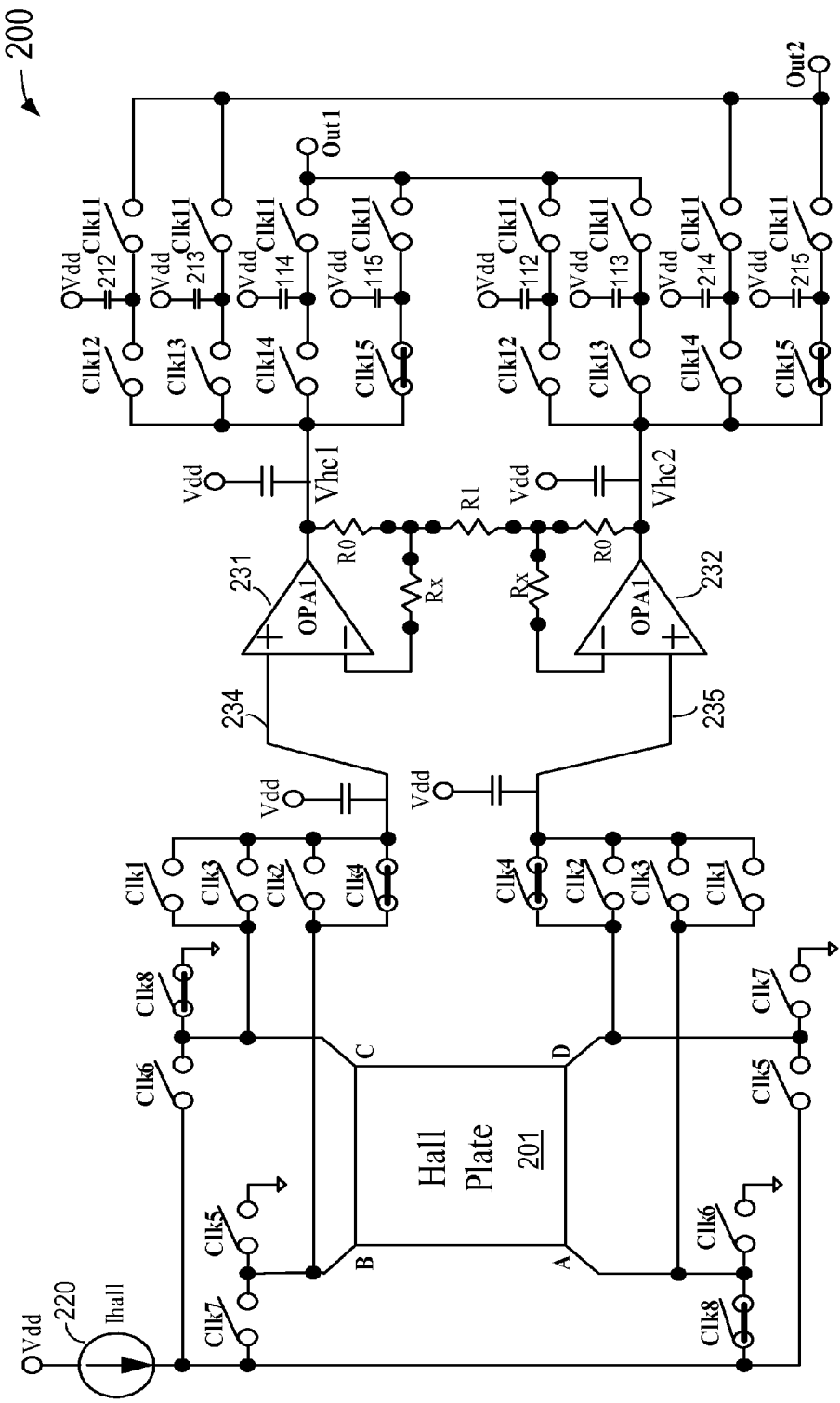
FIG. 7 shows the positions switch amplifier circuit of FIG. 2 during a fourth time period.
Figure 7A:
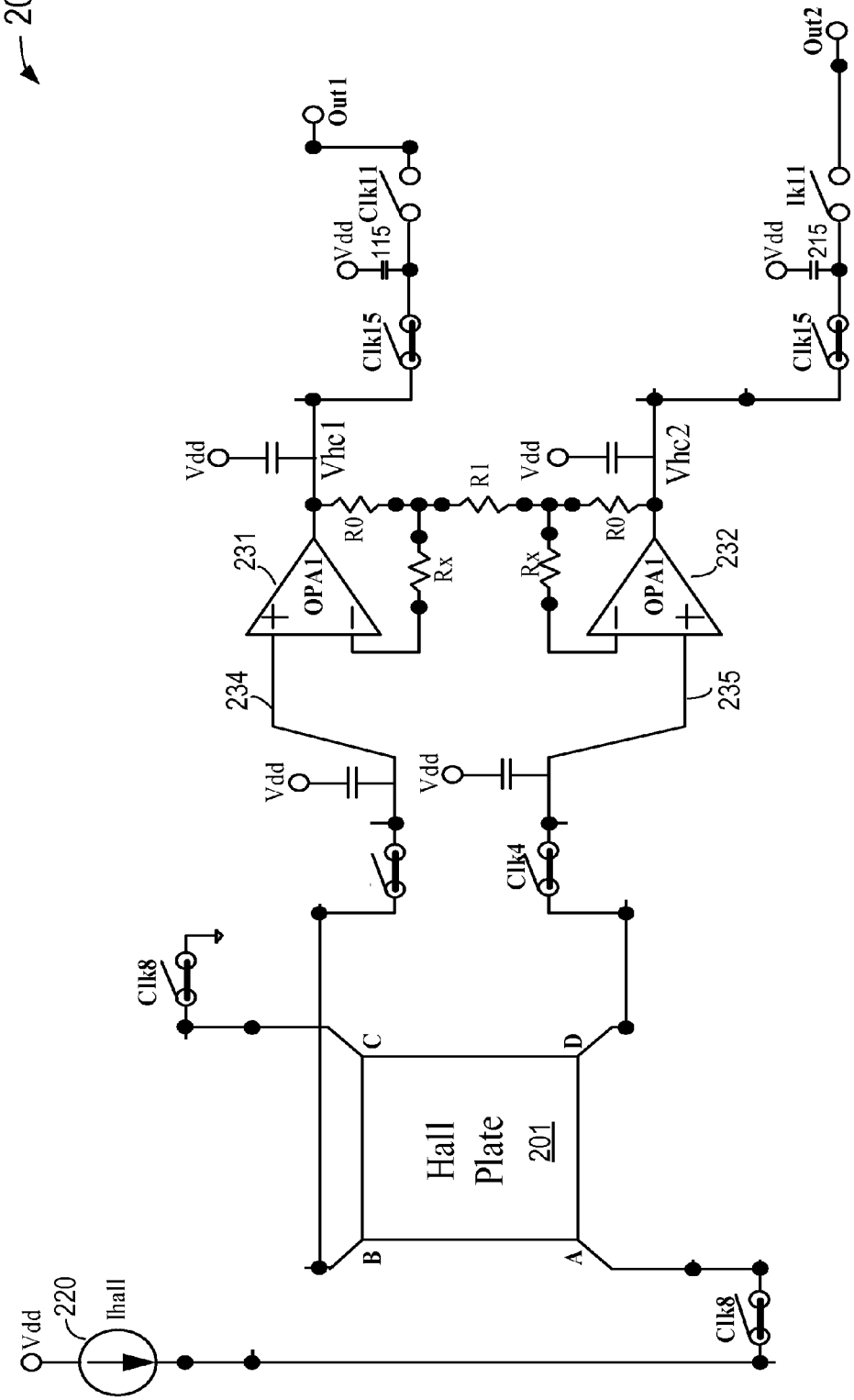
FIG. 7A shows the effective connections during the period.

During a fourth time period T4, as shown in FIG. 3, switches under control of Clk8, Clk4, and Clk15 are closed, and all other switches are open. FIG. 7 shows the positions of switches of system 200 during T4, and FIG. 7A shows the effective connections during T4. It can be seen in FIG. 7A that a current is applied from nodes A to C, and voltages at nodes B and D are coupled to input terminals of the first 231 and second 232 amplifier circuits, respectively. During time period T4, capacitors 115 and 215 are charged with outputs of the first and the second amplifiers 231 and 232, respectively. Capacitors 115 and 215 now hold the sampled voltages of nodes B and D, respectively. The relative pulse width of clock signals Clk8, Clk4, and Clk15 during period T4 is similar to that for period T1.

Figure 8:
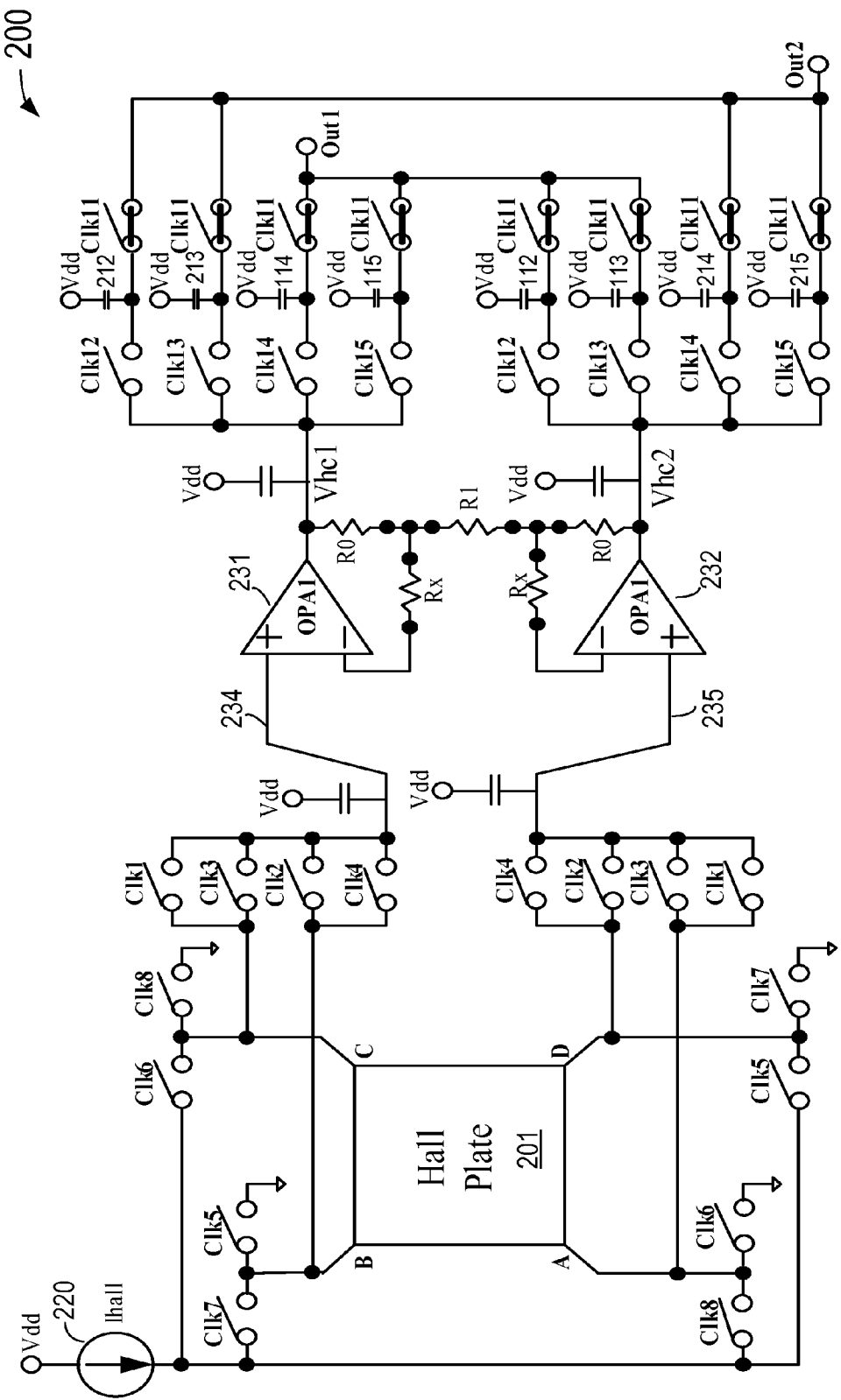
FIG. 8 shows the positions switch amplifier circuit of FIG. 2 during a fifth time period.
Figure 8A:
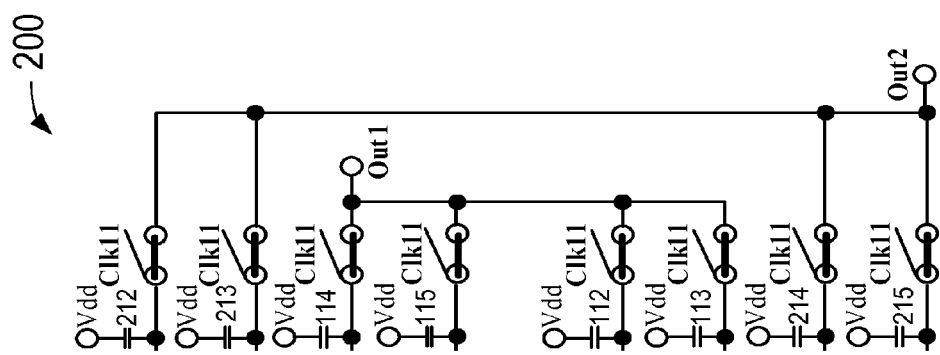
FIG. 8A shows the effective connections during the period.

During a fifth time period T5, as shown in FIG. 3, switches under control of Clk11 are closed, and all other switches are open. FIG. 8 shows the positions of switches of system 200 during T5, and FIG. 8A shows the effective connections during T5. It can be seen in FIG. 8A that capacitors 112, 113, 114, and 115 are coupled to the first different output terminal Out1. And capacitors 212, 213, 214, and 215 are coupled to the second differential output terminal Out2. Thus, a differential Hall voltage signal is provided at the first and the second differential output terminals Out1 and Out2, with the first output terminal Out1 at a voltage that is an average of voltages on capacitors 112, 113, 114, and 115, and the second output terminal Out2 at a voltage that is an average of voltages on capacitors 212, 213, 214, and 215.

It can be seen that, in two of the four samplings, the current are in opposite directions. The offset voltages have the same magnitude but opposite polarities. The output sampled at output terminals Out1 and Out2 have equal magnitude and opposite polarity voltages. As a result, the offset voltage is only one half of the offset voltage produced in the conventional amplifier of FIG. 1. Therefore, the effect of offset voltage can be reduced.

An analysis of the operation of amplifier 200 is now described with reference to FIGS. 2-8A. In the analysis, it is assumed that a magnetic field is perpendicular to Hall plate 201 and in the direction into the Hall plate, but the same result is obtained if the magnetic field is in the opposite direction. When the current flows from nodes A to C, the offset voltage between nodes B and D is Vhos1>0. When the current flows from nodes D to B, the offset voltage between nodes C and A is Vhos2>0.

During time period T1, assuming the current flows from B to D, then the Hall voltage at A is higher than C, and also includes offset voltage Vhos2. The Hall voltage is amplified by operational amplifiers 231 OPA1 and 232 OPA2, and the output voltages are Vhc1 and Vhc2, respectively.

$V_{hc1} = V_C \times \text{Gain}$ $V_{hc2} = V_A \times \text{Gain} = (V_C - V_{hos2} + V_h) \times \text{Gain}$ During time period T2, assuming the current flows from C to A, then the Hall voltage at B is higher than D, and also includes offset voltage Vhos1. The Hall voltage is amplified by operational amplifiers OPA1 and OPA2, and the output voltages are Vhc1 and Vhc2, respectively.

$V_{hc1} = (V_D - V_h - V_{hos1}) \times \text{Gain}$ $V_{hc2} = V_D \times \text{Gain}$ During time period T3, assuming the current flows from B to D, the Hall voltage at C is higher than A, and also includes offset voltage Vhos2. The Hall voltage is amplified by operational amplifiers OPA1 and OPA2, and the output voltages are Vhc1 and Vhc2, respectively.

$V_{hc1} = V_c \times \text{Gain}$ $V_{hc2} = (V_C - V_h + V_{hos2}) \times \text{Gain}$ During time period t4, assuming the current flows from A to C, the Hall voltage at B is higher than D, and also includes offset voltage Vhos1. The Hall voltage is amplified by operational amplifiers OPA1 and OPA2, and the output voltages are Vhc1 and Vhc2, respectively.

$V_{hc1} = (V_D + V_h + V_{hos1}) \times \text{Gain}$ $V_{hc2} = V_D \times \text{Gain}$ Under the control of the clock signals described above, in a cycle of operation that includes time periods T1-T5, four sampled voltages are amplified an held in the capacitors. Four sampled voltages Vhc1 are added and averaged at the Out1 terminal, with a magnitude, $V_{Out1} = (2V_C + 2V_D + 2V_h + V_{hos1} - V_{hos2}) \times \text{Gain} \div 4$ which can rearranged as follows, $$V_{Out1} = \frac{1}{2}(V_C + V_D) \times \text{Gain} + \frac{1}{4}(V_{hos1} - V_{hos2}) \times \text{Gain} + \frac{1}{2} V_h \times \text{Gain}$$

Similarly, four sampled voltage signals Vhc2 are added and averaged at the Out2 terminal, with a magnitude, $V_{Out2} = (2V_C + 2V_D - 2V_h - V_{hos1} + V_{hos2}) \times \text{Gain} \div 4$ which can rearranged as follows, $$V_{Out2} = \frac{1}{2}(V_C + V_D) \times \text{Gain} - \frac{1}{4}(V_{hos1} - V_{hos2}) \times \text{Gain} + \frac{1}{2}V_h \times \text{Gain}$$

When differential output is taken at output terminals Vout1 and Vout2, the output voltage can be expressed as follows.

$$V_O = V_{Out1} - V_{Out2} = V_h \times \text{Gain} + \frac{1}{2}(V_{hos1} - V_{hos2}) \times \text{Gain}$$

In the ideal case, offset voltages Vhos1 and Vhos2 are identical, and the output includes zero offset voltage. However, in reality, offset voltages Vhos1 and Vhos2 are often not equal. It can be seen from the above equation that when offset voltages Vhos1 and Vhos2 are not identical, the net offset voltage in the measured Hall voltage is one half of the offset voltage in conventional amplifier 100 of FIG. 1. This allows more effective suppression of Hall offset voltage, and enable more accurate determination of Hall induced voltage.

According to some alternative embodiments of the invention, a method for determining a Hall voltage for a Hall plate having four nodes includes performing the following sampling steps with each one of the four nodes:
selecting one of the four nodes
providing a current from a first node adjacent to and counterclockwise from the selected node to a second node adjacent to and clockwise from the selected node;
including the voltage on a third node across from the selected node in a first group of sampled voltage; and
including the voltage on the selected node in a second group of sampled voltage.

The method also includes determining a first differential output voltage based on the first group of sampled voltages, and determining a second differential output voltage based on the second group sampled voltages.

In some embodiments of the above method the first differential output voltage is equal to an average of the voltages in the first group of sampled voltages, and the second differential output voltage is equal to an average of the voltages in the second group of sampled voltages. In some embodiments, the method includes storing charges representing the voltage on one of a first group of capacitors. In some embodiments, the method includes storing a numerical value representing the voltage in a memory device.

In examples described above, the method is implemented using a chopper amplifier with clock signals controlling the operation. In some embodiments, the above method implemented using a computer processor. In some embodiments, the method also includes controlling the sampling steps with a computer processor, storing voltage values in a memory device, and computing the differential output voltages based on the first and the second groups of sampled voltages using the computer processor. Here, the memory device can be any type of computer memory devices such as semiconductor memories including DRAM, SRAM, and non-volatile memories, etc.

The above description is illustrative and not restrictive. Many variations of the invention will become apparent to those skilled in the art upon review of this disclosure. The scope of the invention should, therefore, not be limited the above description.

What is claimed is:
1. A chopper amplifier circuit for sensing Hall voltage, the amplifier circuit comprising:
a Hall sampling circuit, including a first switching circuit for selectively coupling each of four nodes of a Hall plate to either a power source or a ground terminal;
a differential amplifier;
a second switching circuit configured for selectively coupling each of the four nodes of the plate to inputs of the differential amplifier;
a Hall voltage signal retaining circuit, including a first group of four storage devices and a second group of four storage devices;
a third switching circuit configured for storing a first output of the differential amplifier to one of the first group of four storage devices and for storing a second output of the differential amplifier to one of the second group of four storage devices; and
a fourth switching circuit configured for selectively coupling the first group of four storage devices to a first output of the chopper amplifier circuit and for coupling the second group of four storage devices to a second output of the chopper amplifier circuit.

2. The circuit of claim 1, wherein the switching circuits are configured for:
measuring and storing first voltage samples by applying an electric current and sampling voltages at a first node and a third node diagonally across from each other, with the electric current flowing between a second and a fourth node such that the current flows in the Hall plate from right to left with respect to the first node and from left to right with respect to the third node;
repeating the above measuring and storing three more times with different nodes assignments; and
averaging the four voltage samples to provide an output Hall voltage.

3. The circuit of claim 2, further comprising a control circuit configured for issuing clock signals to carry out the measuring and storing steps in four different time periods.

4. The circuit of claim 1, wherein the switching circuits comprise MOS transistors.

5. The circuit of claim 1, wherein the switching circuits comprise bipolar transistors.

6. A Hall voltage sensing system, comprising
an input terminal for coupling to a power source;
a first and a second differential output terminals;
a current source coupled to the input terminal for providing a current;
a Hall plate having four nodes, designated as nodes A, B, C, and D, respectively, a first and a second amplifier circuits in a differential configuration;
a plurality of capacitors;
a switching circuit responsive to a set of clock signals and configured to:
during a first time period,
applying a first current from D to B and coupling C and A to input terminals of the first and second amplifier circuits, respectively; and
charging first and second capacitors with outputs of the first and the second amplifiers, respectively;
during a second time period,
applying a second current from C to A and coupling D and B to input terminals of the first and second amplifier circuits, respectively; and
charging third and fourth capacitors with outputs of the first and the second amplifiers, respectively;
during a third time period,
applying a third current from B to D and coupling C and A to input terminals of the first and second amplifier circuits, respectively; and charging fifth and sixth capacitors with outputs of the first and the second amplifiers, respectively;
during a fourth time period,
applying a fourth current from A to C and coupling B and D to input terminals of the first and second amplifier circuits, respectively; and
charging seventh and eighth capacitors with outputs of the first and the second amplifiers, respectively;
during a fifth time period,
coupling the first, second, third, and fourth capacitors to the first different output terminal; and
coupling the fifth, sixth, seventh, and eighth capacitors to the second differential output terminal;
wherein a differential Hall voltage signal is provided at the first and the second differential output terminals; and
wherein the first output terminal is at a voltage that is an average of voltages on the first, second, third, and fourth capacitors and the second output terminal is at a voltage that is an average of voltages on the fifth, sixth, seventh, and eighth capacitors.

7. The circuit of claim 6, wherein the switching circuits comprises MOS transistors.

8. The circuit of claim 6, wherein the switching circuits comprises bipolar transistors.

9. A test circuit for testing a device having four terminals, the circuit comprising:
a power source for providing power to the device;
a ground terminal;
first and second differential output terminals;
a differential amplifier circuit with first and second inputs and first and second outputs;
a first group of four storage devices;
a second group of four storage devices;
a first switching circuit configured for selectively coupling each of the four terminals to either current source or the ground terminal;
a second switching circuit configured for selectively coupling each of the four terminals of the device to the inputs of the differential amplifier circuit;
a third switching circuit configured for storing one of the first or the second outputs of the differential amplifier circuit to one of the first group of four storage devices and for storing the other output of the differential amplifier circuit to one of the second group of four storage devices; and
a fourth switching circuit for selectively coupling the first group of four storage devices to the first differential output of the system and for coupling the second group of four storage devices to the second differential output of the system.

10. The test circuit of claim 9, wherein the switching circuits are configured for:
measuring and storing first signal samples at a first node and a second node, while coupling the power source between a third and a fourth node;
repeating said measuring and storing steps three more times with different nodes assignments; and
determining an output of the test circuit based on four measured signal samples.

11. The test circuit of claim 10, wherein the signal samples comprise voltage signals.

12. The test circuit of claim 10, wherein the signal samples comprise current signals.

13. The test circuit of claim 9, wherein the test circuit is configured for testing a Hall plate.

14. The test circuit of claim 9, wherein the switching circuits comprises MOS transistors.

15. The test circuit of claim 9, wherein the switching circuits comprises bipolar transistors.

16. A method for determining a Hall voltage for a Hall plate having four nodes, the method comprising:
performing the following sampling steps with each one of the four nodes:
selecting one of the four nodes
providing a current from a first node adjacent to and counterclockwise from the selected node to a second node adjacent to and clockwise from the selected node;
determining a voltage on a third node across from the selected node and including said voltage in a first group of sampled voltages; and
determining a voltage on the selected node and including said voltage in a second group of sampled voltages; and
determining a first differential output voltage based on the first group of sampled voltages; and
determining a second differential output voltage based on the second group sampled voltages.

17. The method of claim 16, wherein the first differential output voltage is equal to an average of the voltages in the first group of sampled voltages, and the second differential output voltage is equal to an average of the voltages in the second group of sampled voltages.

18. The method of claim 16, wherein including a voltage in a first group of sampled voltage comprises storing charges representing said voltage on one of a first group of capacitors.

19. The method of claim 16, wherein including a voltage in a first group of sampled voltage comprises storing a numerical value representing said voltage in a memory device.

20. The method of claim 16, further comprising:
controlling the sampling steps with a computer processor;
storing voltage values in a memory device; and
computing the differential output voltages based on the first and the second groups of sampled voltages using the computer processor.

* * * * *